US005631079A

United States Patent [19]

Gutman et al.

[11] Patent Number: 5,631,079
[45] Date of Patent: May 20, 1997

[54] HIGH TEMPERATURE RESISTANT ANTISTATIC PRESSURE-SENSITIVE ADHESIVE TAPE

[75] Inventors: Gustav Gutman; Steven D. Yau, both of Austin, Tex.

[73] Assignee: Minnesota Mining and Manufacturing Company, St. Paul, Minn.

[21] Appl. No.: 496,533

[22] Filed: Jun. 29, 1995

Related U.S. Application Data

[63] Continuation-in-part of Ser. No. 239,309, May 6, 1994, abandoned.

[51] Int. Cl.⁶ ........................... B32B 5/16
[52] U.S. Cl. .................. 428/327; 428/353; 428/356; 428/407; 428/506; 428/520
[58] Field of Search ........................... 428/327, 353, 428/355, 356, 407, 506, 520; 252/521

[56] References Cited

U.S. PATENT DOCUMENTS

| | | | |
|---|---|---|---|
| 3,104,985 | 9/1963 | Williams | 117/226 |
| 3,691,140 | 9/1972 | Silver | 260/78.5 |
| 3,832,598 | 8/1974 | Oehmke et al. | 317/2 B |
| 4,166,152 | 8/1979 | Baker et al. | 428/522 |
| 4,636,432 | 1/1987 | Shibano et al. | 428/327 |
| 4,656,218 | 4/1987 | Kinoshita | 524/460 |
| 4,749,612 | 6/1988 | Borkowski et al. | 428/246 |
| 5,045,569 | 9/1991 | Delgado | 521/60 |
| 5,378,405 | 1/1995 | Gutman et al. | 252/62 |

FOREIGN PATENT DOCUMENTS

| | | | |
|---|---|---|---|
| 0422919A2 | 4/1991 | European Pat. Off. | C09J 7/02 |
| 63-12681-A | 1/1988 | Japan | C09J 7/02 |

*Primary Examiner*—Hoa T. Le
*Attorney, Agent, or Firm*—Gary L. Griswold; Walter N. Kirn; Darla P. Neaveill

[57] ABSTRACT

A heat-resistant anti-static pressure-sensitive adhesive tape comprising a substrate having coated thereon an acrylic microparticulate adhesive having an average diameter of at least about 1 micrometer, wherein the microparticles have a surface bearing thereon a conductive material formed from a polymer electrolyte base polymer, and at least one ionic salt selected from the group consisting of salts of alkali metals and salts of alkaline earth metals, said adhesive being adhered to said substrate by means of a primer, said primer comprising at least one phenolic resin and at least one rubbery compound, said adhesive tape being capable of surviving immersion in molten solder for at least about 5 seconds.

17 Claims, No Drawings

N° 5,631,079

HIGH TEMPERATURE RESISTANT ANTISTATIC PRESSURE-SENSITIVE ADHESIVE TAPE

This application is a continuation-in-part of Ser. No. 08/239,309, filed May 6, 1994 abandoned.

BACKGROUND OF THE INVENTION

1. Field of the Invention

The invention relates to pressure-sensitive adhesive tape constructions which are useful for masking printed circuit boards (PCBs) at the high temperatures associated with wave soldering operations. These adhesive tapes, which comprise conductive acrylic polymeric microparticulate adhesive formulations with a special primer, provide tapes extremely resistant to tribocharging, thereby protecting electronic components from static charge buildup. In addition, the adhesive masking tape, upon removal from a PCB, does not contaminate the surface of the board with adhesive residue.

2. Description of the Art

The process of wave soldering is commonly used for permanently attaching electronic components to printed circuit boards. Various methods are used to mask or cover areas of the board during the wave soldering attachment process where solder is not desired. It is known, for example, to achieve such masking by use of self-adhesive tapes based on high-temperature-resistant polyimide film coated with a silicone-based adhesive. However, the removal of such tapes from the surface of electronic assemblies causes tribocharging accompanied by static charges which can damage sensitive electronic components and can also cause contamination of the printed circuits by silicone.

Electrically conductive tapes are also useful for the masking purpose. Electrically conductive tapes do not tribocharge as readily as those made from insulating materials such as silicones. The use of conductive tapes, in assembly operations, therefore, will reduce the failure rate of electronic components.

Several different types of conductive tape are known for use at ambient temperatures. U.S. Pat. Nos. 3,104,985, 3,832,598 and U.S. Pat. No. 4,749,612 describe adhesive tapes with a coating of carbon black in a binder which is taught to dissipate electrostatic charges. Various patents also disclose multiple layer tape structures wherein one of the layers, usually a buried layer, is electrically conductive.

For example, Japanese Patent Publication J63012681-A discloses a tape with an intermediate, antistatic polymer layer situated between a polyolefin support and a rubber adhesive layer.

European Patent Publication EP 0422919-A2 discloses a tape having a layer of conductive particles or conductive foil surrounded by binder, situated between a polymer film support and a silicone adhesive. The use of a high temperature film support, polyimide, combined with silicone binder and adhesive, is stated to yield a tape which will perform well as a wave solder masking tape at temperatures unsuitable for earlier antistatic tapes, i.e., this tape will survive in a wave solder bath for at least about 5 seconds at 250° C.

Antistatic or conductive tapes which rely on the use of conductive particles require high concentrations of these particles to provide sufficient electrostatic charge neutralization in order to provide the effect of the conductive particles at the surface of an otherwise insulative adhesive. Without surface activity, static free masking of electronic assemblies cannot be achieved, as charge transfer to the underlying layer of conductive particles requires a conductive pathway through the adhesive. However, high particulate concentrations often lead to loss of adhesion and undesirable transfer of contaminating adhesive material to the bonded surface. Adhesive transfer must be balanced against tribocharging; the use of additional polymeric binder will reduce transfer but may electrically insulate adjacent conductive particles and thus cause increased tribocharging.

The need for balance between particle loading and polymeric binder could be avoided by use of an inherently conductive adhesive layer. However, there is no known disclosure of a wave solder masking tape using an inherently conductive adhesive in direct contact with the printed circuit board. Whether conductive in nature or not, most non-silicone adhesives will not survive the wave soldering process, and are thus not useful for such an application.

Particulate adhesives are also known in the art, and have been coated on a variety of substrates and used primarily in applications requiring a low level of adhesion, e.g., repositionability. Such spheres and their use in aerosol adhesive systems having repositionable properties are disclosed in U.S. Pat. No. 3,691,140 (Silver). These microparticles are prepared by aqueous suspension polymerization of alkyl acrylate monomers and ionic comonomer, e.g., sodium methacrylate, in the presence of an emulsifier. The use of a water-soluble, substantially oil-insoluble ionic comonomer is critical to preventing coagulation or agglomeration of the microparticles. However, particulate adhesives disclosed in the prior art have all been useful as repositionable adhesives for such applications as Post-It™ brand notes, and other removable items. Pressure-sensitive tapes made with this type of adhesive are likely to be considered unsuitable for use as antistatic tapes due to their lack of conductivity, and ease of removal. Further, acrylic adhesives have not been considered to be heat resistant in nature.

U.S. Pat. No. 5,378,405 discloses conductive microparticulate adhesives, and antistatic tapes made therefrom. The conductivity is due to the presence of an ionic conductive material present on the surface of the microparticle. The antistatic adhesive tapes disclosed in this patent, while exhibiting extremely low tribocharging upon use and removal, also exhibit adhesive transfer when exposed to the high temperatures of molten solder.

The current inventors have now discovered an inherently conductive adhesive tape useful at the high temperatures required by wave solder baths. The synergistic behavior of a specific primer and an acrylic microparticulate adhesive provides a tape construction which is useful for wave soldering applications without the adhesive transfer or tribocharging problems of previously disclosed wave solder masking tapes.

Adhesive tapes of the invention comprise conductive acrylic microparticulate adhesives having polymer electrolytes on the surface of each adhesive particle which provides conductive particles which are useful as antistatic adhesive compositions. Surprisingly such adhesives, when coated atop a primer containing both a phenolic constituent and a rubbery constituent exhibit high temperature resistance with low adhesive transfer when run through a wave solder bath at 260° C. or more.

Adhesive tapes of the invention provide antistatic tapes which are extremely effective in dissipating electrostatic charge and may be used in sensitive applications without worry about adhesive transfer. These tapes provide excellent electrical properties essentially with substantially no adhesive transfer due to the excellent adhesion between the adhesive tape and the primer therefor, even at high temperatures.

SUMMARY OF THE INVENTION

The invention provides a high-temperature resistant, anti-static pressure-sensitive adhesive tape comprising a polymeric film support bearing thereon a primer which causes a non-tribocharging, acrylic, microparticulate adhesive to strongly adhere to the backing. This tape has the capacity to survive immersion in molten solder, at elevated temperatures, essentially unchanged for periods of at least about 5 seconds. Preferred tapes of the invention survive for periods of at least about 20 seconds. Conventional microsphere tapes would have high levels of adhesive transfer to the bonded surface under such conditions.

More specifically, the invention provides a heat-resistant anti-static pressure-sensitive adhesive tape comprising a substrate having opposing surfaces, at least one surface bearing thereon, a microparticulate adhesive having an average diameter of at least about 1 micrometer, wherein the microparticles have a surface bearing thereon an ionic conductive material formed from a polymer electrolyte base polymer, and at least one ionic salt selected from the group consisting of salts of alkali metals and salts of alkaline earth metals, said adhesive being adhered to said substrate by means of a primer, said primer comprising at least one phenolic resin and at least one rubbery compound, said adhesive tape surviving in a wave-solder bath for at least about 5 seconds.

Preferably, the heat-resistant anti-static pressure-sensitive adhesive tape of the invention comprises an adhesive polymer of monomers comprising:

a) at least about 70 parts of at least one alkyl (meth) acrylate or vinyl ester, b) correspondingly, up to about 30 parts of at least one polar monomer, to make 100 parts monomer, and wherein said ionic conductive material comprises a polymer electrolyte formed from a polymer electrolyte base polymer, said polymer electrolyte base polymer added in an amount of from about 0.1 part to about 10 parts, said adhesive being adhered to said substrate by means of a primer composition, said primer comprising at least one phenolic formaldehyde resin and at least one rubbery compound selected from the group consisting of butyl rubbers, acrylonitrile-butadiene, acrylonitrile-butadiene-styrene copolymers, styrene-butadiene-styrene, styrene-ethylene butylene-styrene, polychloroprene, polybutadiene, polyisoprene, styrene-isoprene-styrene, and mixtures thereof, said adhesive tape surviving in a wave-solder bath for at least about 10 seconds.

As used herein, these terms have the following meanings.

1. The term "polymer electrolyte" means a polymeric species containing electron donating atoms which may be associated with acceptor atoms.

2. The term "polymer electrolyte base polymer" means a polymer which is capable of forming a polymer electrolyte during formation of the microparticle.

3. The term "polymer electrolyte functional unit" means the group containing the electron donating species.

4. The term "microparticle" means a particle having a diameter of from about 1 micrometer to about 250 micrometers.

5. The term "tribocharging" means electrostatic charge generation associated with friction or separation between separable surfaces.

6. The term "droplet" means the liquid stage of the microparticles prior to the completion of polymerization.

7. The term "cavity" means a space within the walls of a droplet or microparticle when still in the suspension or dispersion medium prior to drying, and thus containing whatever medium was used.

8. The term "void" means an empty space completely within the walls of a polymerized microparticle.

9. The term "hollow" means containing at least one void or cavity.

10. The term "solid" means voids or cavity-free.

11. The term "alkyl (meth)acrylate" means an alkyl acrylate or alkyl methacrylate.

12. The term "modified surface" means a surface which has been subjected to a priming, coating or treatment such as chemical or radiation treatment such that the original properties of the surface have been changed.

As used herein, all parts, percents, and ratios are by weight, unless specifically stated otherwise.

DETAILED DESCRIPTION OF THE INVENTION

Tapes of the invention must comprise a microparticulate conductive adhesive, and a phenol/rubber primer. Alkyl acrylate or methacrylate monomers useful in preparing the microparticle conductive pressure-sensitive adhesives for use in tapes of this invention are those monofunctional unsaturated acrylate or methacrylic esters of non-tertiary alkyl alcohols, the alkyl groups of which have from 4 to about 14 carbon atoms. Such acrylates are oleophilic, water emulsifiable, have limited water solubility, and as homopolymers, generally have glass transition temperatures below about −20° C. Included within this class of monomers are, for example, isooctyl acrylate, 4-methyl-2-pentyl acrylate, 2-methylbutyl acrylate, isoamyl acrylate, sec-butyl acrylate, n-butyl acrylate, 2-ethylhexyl acrylate, isodecyl methacrylate, isononyl acrylate, isodecyl acrylate, and the like, singly or in mixtures.

Preferred acrylates include isooctyl acrylate, isononyl acrylate, isoamyl acrylate, isodecyl acrylate, 2-ethylhexyl acrylate, n-butyl acrylate, sec-butyl acrylate, and mixtures thereof. Acrylate or methacrylate or other vinyl monomers which, as homopolymers, have glass transition temperatures higher than about −20° C., e.g., tert-butyl acrylate, vinyl acetate, and the like, may be utilized in conjunction with one or more of the acrylate or methacrylate monomers provided that the glass transition temperature of the resultant polymer is below about −20° C. When methacrylate monomer is the sole alkyl acrylate utilized, a crosslinking agent, infra, must be included.

Useful vinyl ester monomers are those which form homopolymers having glass transition temperatures below about 10° C. Such esters comprise 1 to 14 carbon atoms, and includes such monomers as vinyl 2-ethylhexanoate, vinyl caproate, vinyl laurate, vinyl pelargonate, vinyl hexanoate, vinyl propionate, vinyl decanoate, vinyl octanoate, and the like.

Useful polar monomers include moderately polar monomers such as N-vinyl-2-pyrrolidone, N-vinyl caprolactam, acrylonitrile, vinyl acrylate, and diallyl phthalate, as well as strongly polar monomers such as acrylic acid, methacrylic acid, itaconic acid, hydroxyalkyl acrylates, cyanoalkyl acrylates, acrylamides, substituted acrylamides. When more than one polar monomer is used, mixtures may include monomers having similar or unlike polarities, e.g., one moderately polar and one strongly polar monomer or two monomers from one group.

The conductive microparticles and the pressure-sensitive adhesives made therefrom comprise at least about 70 parts by weight of at least one alkyl (meth) acrylate ester or vinyl ester and correspondingly, up to about 30 parts by weight of one or more polar monomers.

Polymer electrolyte base polymers suitable for use include polyethylene oxide, polyphenylene oxide, polyphenylene sulfide, polyethylene sulfide, polyethyleneimine, polypropylene oxide, polybutylene oxide, polybutylene sulfide, polybutylene imine, and the like. Polyethylene oxide is preferred. Useful amounts of the polymer electrolyte base polymer in microparticles of the invention range from about 0.1 part to about 10 parts, preferably from about 1 part to about 5 parts, based on 100 parts monomer weight.

The conductive properties of the polymeric microparticles may be further enhanced by the addition of ionic salts to adhesive compositions which contain the microparticles. It is believed that the ionic salts become associated with the electron donating groups present in the amorphous polymer domains.

Salts used for this purpose include salts of alkali metals, and alkaline earth metals, including but not limited to, NaI, NaSCN, $BaCF_3So_3$, NaBr, $NaClO_4$, LiCl, $LiNO_3$, $LiCF_3SO_3$, $LiSO_4$, LiOH and KOH. Lithium salts are preferred for the present invention, especially lithium nitrate.

Microparticles may be prepared by various emulsification processes, which are varied depending on whether hollow or solid microparticles are desired. Aqueous suspensions of hollow microparticles may be prepared by a "two-step" emulsification process which first involves forming a water-in-oil emulsion of an aqueous solution of polar monomer(s) in oil phase monomer, i.e., at least one (meth)acrylate or vinyl ester monomer, with a polymer electrolyte base polymer, using an emulsifier having a low hydrophilic-lipophilic balance (HLB) value. Suitable emulsifiers are those having an HLB value below about 7, preferably in the range of about 2 to about 7. Examples of such emulsifiers include sorbitan monooleate, sorbitan trioleate, and ethoxylated oleyl alcohol such as Brij™ 93, available from Atlas Chemical Industries, Inc.

Thus, in this first step, oil phase monomer(s), polymer electrolyte base polymer, emulsifier, a free radical initiator, and, optionally, a crosslinking monomer or monomers as defined below are combined, and an aqueous solution of all or a portion of the polar monomer(s) is agitated and poured into the oil phase mixture to form a water-in-oil emulsion. The polymer electrolyte base polymer may be added to either the oil phase or the water phase. A thickening agent, e.g., methyl cellulose may also be included in the aqueous phase of the water-in-oil emulsion. In the second step, a water-in-oil-in-water emulsion is formed by dispersing the water-in-oil emulsion of the first step into an aqueous phase containing an emulsifier having an HLB value above about 6. The aqueous phase may also contain any portion of the polar monomer(s) which was not added in step one. Examples of such emulsifiers include ethoxylated sorbitan monooleate, ethoxylated lauryl alcohol, and alkyl sulfates. In both steps, when an emulsifier is utilized, its concentration should be greater than its critical micelle concentration, which is herein defined as the minimum concentration of emulsifier necessary for the formation of micelles, i.e., sub-microscopic aggregations of emulsifier molecules. Critical micelle concentration is slightly different for each emulsifier, usable concentrations ranging from about $1.0\times 10^{-4}$ to about 3.0 moles/liter. Additional detail concerning the preparation of water-in-oil-in-water emulsions, i.e., multiple emulsions, may be found in various literature references, e.g., *Surfactant Systems: Their Chemistry, Pharmacy, & Biology*, (D. Attwood and A. T. Florence, Chapman & Hall Ltd, New York City, 1983).

The final process step of this method involves the application of heat or radiation to initiate polymerization of the monomers. Useful initiators are those which are normally suitable for free radical polymerization of acrylate or vinyl ester monomers and which are oil-soluble and of very low solubility in water. However, when the polar monomer is N-vinyl pyrrolidone, the use of benzoyl peroxide as the initiator is recommended.

Examples of such inimiators include azo compounds, hydroperoxides, peroxides, and the like, and photoinitiators such as benzophenone, benzoin ethyl ether, and 2,2-dimethoxy-2-phenyl acetophenone.

Use of a water-soluble polymerization initiator causes formation of substantial amounts of latex. The extremely small particle size of latex particles renders any significant formation of latex undesirable. The initiator is generally used in an amount ranging from about 0.01 percent up to about 10 percent by weight of the total polymerizable composition, preferably up to about 5 percent.

Aqueous suspensions of hollow conductive microparticles may also by prepared by a "one-step" emulsification process comprising aqueous suspension polymerization of at least one alkyl (meth)acrylate ester monomer or vinyl ester monomer and at least one polar monomer and a polymer electrolyte base polymer in the presence of at least one emulsifier capable of producing a water-in-oil emulsion inside the droplets which is substantially stable during emulsification and polymerization. As in the two-step emulsification process, the emulsifier is utilized in concentrations greater than its critical micelle concentration. In general, high HLB emulsifiers are required, i.e., emulsifiers having an HLB value of at least about 25, will produce stable cavity-containing droplets during the polymerization, and are suitable for use in this one-step process. Examples of such emulsifiers include alkylarylether sulfates such as sodium alkylarylether sulfate, e.g., Triton™ W/30, available from Rohm and Haas, alkylarylpolyether sulfates such as alkylarylpoly(ethylene oxide) sulfates, preferably those having up to about 4 ethyleneoxy repeat units, and alkyl sulfates such as sodium lauryl sulfate, ammonium lauryl sulfate, triethanolamine lauryl sulfate, and sodium hexadecyl sulfate, alkyl ether sulfates such as ammonium lauryl ether sulfate, and alkylpolyether sulfates such as alkyl poly (ethylene oxide) sulfates, preferably those having up to about 4 ethyleneoxy units. Alkyl sulfates, alkyl ether sulfates, alkylarylether sulfates and mixtures thereof are preferred as they provide a maximum void volume per microparticle for a minimum amount of surfactant. Nonionic emulsifiers, e.g., Siponic™ Y-500-70 (ethoxylated oleyl alcohol), commercially available from Alcolac, Inc., and Pluronic™ P103 (a block copolymer of polypropylene oxide and polyethylene oxide commercially from BASF Corporation) can be utilized alone or in conjunction with anionic emulsifiers. Polymeric stabilizers may also be present but are not necessary.

The composition may also contain a crosslinking agent such as a multifunctional (meth)acrylate, e.g., butanediol diacrylate or hexanediol diacrylate, or other multifunctional crosslinker such as divinylbenzene. When used, crosslinker (s) is (are) added at a level of up to about 1 percent, preferably up to about 0.5 percent, of the total polymerizable composition.

Solid microparticles also useful in tapes of the invention may be made by a similar one-step process comprising aqueous suspension polymerization of at least one alkyl (meth)acrylate ester monomer or vinyl ester monomer, at least one polar monomer and a polymer electrolyte base polymer in the presence of an suspension stabilizer. It is not necessary to use a high HLB emulsifier because the droplets formed need not be cavity-containing droplets. Examples of such useful lower HLB emulsifiers include ammonium lauryl sulfate such as Standapol™ A, available from Hercules and other steric or electrosteric polymeric stabilizers such as (poty)vinyl alcohol, polyacrylic acid, polymethacrylic acid, polyacrylamide, polyvinyl pyrrolidone, polyvinyl methylether, and the like.

Microsphere preparation may be modified by withholding the addition or all or part of the polymer electrolyte base polymer, and polar monomers until after polymerization of the oil phase is initiated; however, the components must be added to the polymerizing mixture prior to 100% polymer conversion.

Discrete conductive polymeric microparticles may also be prepared via suspension polymerizations disclosed in U.S. Pat. No. 3,691,140, U.S. Pat. No. 4,166,152, U.S. Pat. No. 4,636,432, U.S. Pat. No. 4,656,218, and U.S. Pat. No. 5,045,569, for preparing adhesive compositions.

The conductive microparticles are normally tacky, elastomeric, insoluble but swellable in organic solvents, and small, typically having diameters of at least about 1 micrometer, preferably in the range of about 1 to about 250 micrometers, more preferably from about 1 to about 50 micrometers. They may be solid, contain a single void, or multiple voids.

Following polymerization, an aqueous suspension of the microparticles is obtained which is stable to agglomeration or coagulation under room temperature conditions. The suspension may have non-volatile solids contents of from about 10 to about 50 percent by weight. Upon prolonged standing, the suspension separates into two phases, one phase being aqueous and substantially free of polymer, the other phase being an aqueous suspension of conductive microparticles. Where high HLB emulsifiers are used the droplets have one or more cavities which, upon drying, become voids. Both phases may contain a minor portion of small latex particles. Decantation of the microparticle-rich phase provides an aqueous suspension having a non-volatile solids content on the order of about 40–50 percent which, if shaken with water, will readily redisperse.

The adhesion properties of the microparticles may be altered by addition of tackifying resin and/or plasticizer. Preferred tackifiers for use herein include hydrogenated rosin esters commercially available from companies such as Hercules Inc., under such trade names as Foral™ 65, Foral™ 85, Foral™ 105, and Tacolyn™. Other useful tackifiers include those based on t-butyl styrene. Useful plasticizers include dioctyl phthalate, 2-ethyl hexyl phosphate, tricresyl phosphate, and the like.

It is also within the scope of this invention to include various other components to the adhesives used in tapes of the invention, such as pigments, fillers, including additional conductive fillers, stabilizers, or various polymeric additives.

The surface(s) bearing the microparticulate adhesive thereon are primed surfaces. Primers useful in tapes of the invention comprise at least one phenolic resin and at least one rubbery component.

Useful rubbery components include natural rubbers such as butyl rubbers, and various synthetic compounds, including but not limited to, acrylonitrile-butadiene, acrylonitrile-butadiene-styrene copolymers, styrene-butadiene-styrene, styrene-ethylene butylene-styrene, polychloroprene, polybutadiene, polyisoprene, styrene-isoprene-styrene, and mixtures thereof. Preferred primers contain mixtures of two or more rubbery compounds, such as acrylonitrile-butadiene, and polychloroprene.

Useful phenolic resins, include but are not limited to, phenol formaldehyde resin, available commercially from Union Carbide under the trade names UCAR BKR-2620, and UCAR CK-1635, novolak resins and the like, and mixtures thereof. Preferred primers contain from about 40 to about 120, preferably from about 40 to about 100 parts of phenolic resin per 100 parts of rubbery compound.

Surprisingly, such primers when used with the acrylic microparticle adhesive, generate such a strong bond that virtually no adhesive transfer is seen, even at high temperatures. When other primers, primer systems or surface treatments of the substrate are substituted, adhesive transfer from the tape to the bonded substrate is seen when the tape is exposed to high temperatures, or even at room temperature in some cases.

The primer may further comprise additives such as tackifying agents, antioxidants, colorants, viscosity adjusting agents, solvents and other conventional additives, which may be used in such amounts as are known in the art.

Preferred tackifying agents include hydrogenated rosin esters, include those available from Hercules under such trade names as Piccolyte™, Foral™, Pentalyn™, and the like.

Preferred primers include from about 15 to about 100 parts of tackifier.

Tapes of the invention may be produced by coating microparticle-containing compositions of the invention onto a variety of high-temperature resistant substrates which have been precoated with primer. Suitable substrates include polymeric films such as polyimide and poly-phenylene sulfide, heat-treated non-wovens, fiberglass, metallized polymeric film, ceramic sheet material, metal foils, etc. The substrate, or tape backing, as it is sometimes called, must be able to withstand temperatures of at least about 200° C. and preferably about 260° C., without degrading or releasing the adhesive from the surface.

Coating of the adhesive and the primer may be carried out by conventional methods such as knife coating, Meyer bar coating, and other conventional means known in the art for coating adhesives such as use of an extrusion die.

The tape may be commercialized in roll form, or may be divided into segments for sale, such as strips or labels. Additionally, the adhesive may be provided between two substrates, e.g., the adhesive is coated onto a polyimide substrate, which may be provided on a low adhesion backsize or other easily removable surface for individual use.

These and other aspects of the invention are illustrated by the following examples which should not be viewed as limiting in scope.

| Glossary | |
|---|---|
| IOA | Isooctyl Acrylate |
| AA | Acrylic Acid |
| PEO | Polyethylene Oxide |
| PEO (750) | Acrylate terminated PEO having a MW of about 750) |

-continued

| Glossary | |
|---|---|
| BPER | 70% Benzoyl Peroxide, Lucidol ™ 70 |
| PEODMA | Polyethylene Oxide Dimethacrylate [(PEO)₉DMA] |
| 1,6 HDDA | 1,6 Hexanediol Diacrylate |
| ALS | Ammonium Lauryl Sulfate |
| Standapol ™ A | Ammonium Lauryl Sulfate from Hercules |
| Santivar A | Antioxidant di-tertiary amyl hydroquinone |
| Piccolyte ™ S115 | Polyterpene resin (tackifier) |
| Zirex ™ | Zinc Resinate (tackifier) |
| Phenolic Resins: | |
| CK-1635 | Pheno-Formaldehyde Resin, also designated CK-1635 UCAR, manufactured by Union Carbide |
| BKR-2620 | Phenol-Formaldehyde Resin, also designated BKR-2620 UCAR, manufactured by Union Carbide. |

TEST METHODS

Tribocharging Measurements of Antistatic Coatings

The separation of materials which have been laminated to each other causes the generation of electrical charge on the surfaces which were previously in contact. It is possible to calculate the magnitude of the electrical charge as a measure of volts generated.

Voltages were conveniently measured using a 3M 711 Charge Analyzer, available from Minnesota Mining and Manufacturing Co. This equipment includes a voltage sensor, mounted in a suitable enclosure. The enclosure is provided with a digital read-out of voltage measured with respect to a stainless steel plate which is horizontally disposed ate insulatively attached above the enclosure. Static charge development may be measured for adhesive tapes of the invention by laminating the tape with its adhesive face in contact with the surface of the stainless steel plate.

A strip of tape, 2.5 cm wide by 15.2 cm long (1.0" wide×6.0" long) is applied to the upper surface of the stainless steel plate using a 1.4 kg (3 lb) roller. The steel plate is then grounded to zero the digital display. Next, a free end of the tape is grasped and using a uniformly applied force, the tape is peeled away from the surface of the steel plate at a rate of 0.30 meters/sec. The voltage developed on the steel plate is displayed via digital read-out. After this reading is noted, the detector is zeroed by grounding the steel plate. The tape which was previously peeled from the steel plate, is next positioned as close as possible to the steel plate without touching it. A second reading of voltage is displayed which represents the voltage residing on the surface of the tape.

It is possible to determine the voltage generated during separation of adhesive tapes of the invention from a printed circuit board by attachment of a suitable board to the surface of the stainless steel plate. Adhesive tape is then attached to the circuit board using the procedure described previously for the steel plate. Upon peeling the tape from the circuit board a voltage reading is displayed which reflects the charge generated on the surface of the circuit board. Following the process of zeroing the instrument, by grounding, the residual charge on the tape is measured by positioning the peeled tape in close proximity to the steel plate.

Tribocharging during unwind of a roll of tape is also measured using the 3M 711 Charge Analyser. In this case a length of tape approximately 0.30 meter long is unwound from a roll of adhesive tape but not removed from it. When the unwound length is placed in close proximity to the previously grounded steel plate, a voltage reading is displayed which represents the magnitude of the charge on the tape.

Adhesive Transfer

With tapes of the current invention it is important to prevent adhesive transfer from the tape onto the surface of electronic assemblies which are subject to wave soldering. The test measures the ability of the tape to maintain a strong bond between film support and adhesive even at the elevated temperature of molten solder.

A tape sample 2.5 cm wide×7.6 cm long is applied with its adhesive in contact with the surface of a 4.45 cm×10 cm section of dust-free printed circuit board (PCB). A small portion of the tape overlaps an edge portion of the PCB to facilitate subsequent removal. Pressure from a 1.4 kg teller assures consistent application of the tape samples. These test pieces are then positioned in a molten solder bath so that the tape is held below the surface of the solder for a desired length of time.

After removal from the solder bath, the test pieces are allowed to cool to room temperature. The free end of the tape is grasped and drawn away from the edge of the PCB. Observation is made to determine if the adhesive separates from the film support, thereby leaving an unwanted residue on the surface of the PCB.

Two-Bond Adhesion Test

A piece of adhesive tape is folded onto itself in such a fashion that one area of the adhesive layer contacts a second area of the adhesive. These are permitted to bond, and the separated using an Instron® testing device. The amount of force to separate the bond is the two bond adhesion value.

EXAMPLES

Preparations of Microparticles

Example 1

Acrylic acid (5.4 g), polyethylene oxide acrylate (PEO 750) (13.5 g), PEODMA (0.15 g) and 70% benzoyl peroxide (0.99 g) were dissolved in isooctyl acrylate (223.2 g). This solution was added to an aqueous solution of surfactant. The surfactant solution comprised Standapol™A, available from Hercules, (8.4 g) dissolved in de-ionized water (360 g). An emulsion of the isooctyl acrylate solution in the aqueous solution was produced by high shear mixing using an Omni mixer at setting 5. Mixing was continued until the average particle size of the oily droplets was approximately 3 μm. Size was determined using an optical microscope.

The resulting oil-in-water emulsion was charged to a 1-liter resin reactor equipped with four baffles, a paddle stirrer and a suitable heat source, such as a heating mantle. With continuous stirring at a rate of 400 rpm, the reactor and contents were heated to 60° C.

At this point the reactor was degassed with nitrogen. A reaction proceeded in the absence of oxygen. This was allowed to continue for a period of 22 hours while both temperature and stirring rate were maintained. The resulting aqueous suspension contained insoluble particles of approximately 5 μm in diameter.

Example 2

| Ingred. | Parts | % solids |
|---|---|---|
| Primer Composition for Polyimide Substrate | | |
| Butadiene/Acrylonitrile | 75.00 parts | 25.63 |
| Neoprene W. | 25.00 parts | 8.54 |
| Phenolic Resin BKR-2620 | 19.90 parts | 6.8 |
| Santivar A | 3.95 parts | 1.35 |
| Piccolyte S115 | 49.67 parts | 16.97 |
| Zirex | 49.61 parts | 16.97 |
| Phenolic Resin | 69.43 parts | 23.73 |
| Methyl Ethyl Ketone | 329.57 parts | |
| iso-Propanol | 60.00 parts | |
| Toluene | 621.00 parts | |
| Physical Properties | | |
| S. G. of Solids: 1.065 | S. G. of Solution: 0.884 | |
| # per Gallon: 7.370 | % Comb. RHC Soln.: 7.67 | |
| % Comb. RHC on Solids: 34.17 | % Theoretical Solids: 22.45 | |
| Preparation of Primer Solution Materials | | |
| Butadiene/Acrylonitrile | 75.00 parts | 5.755% |
| Neoprene ™ W. | 25.00 parts | 1.918% |
| Phenolic Resin BKR-2620 | 19.90 parts | 1.527% |
| Santivar ™ A | 3.95 parts | 0.303% |
| Piccolyte ™ S115 | 49.67 parts | 3.811% |
| Zirex ™ | 49.67 parts | 3.811% |
| Phenolic Resin | 69.43 parts | 5.328% |
| Methyl Ethyl Ketone | 329.57 parts | 25.290% |
| iso-Propanol | 60.00 parts | 4.604% |
| Toluene | 621.00 parts | 47.652% |

The resins, tackifiers and antioxidant, indicated above, are dissolved in a mixed solvent comprising methyl ethyl ketone, iso-propanol and toluene to provide a primer coating for film supports. Conventional churns, equipped with stirrers, or similar equipment may be used for primer solution preparation. The solution is inspected for clarity and filtered if necessary.

Example 3

| Adhesive Coating Composition | |
|---|---|
| Adhesive[1] | 100 parts |
| Lithium Nitrate | 0.40 parts |
| Lithium Hydroxide | 0.28 parts |
| Ammonium Hydroxide | 0.60 parts |
| Benzotriazole[2] | 0.05 parts |
| Thickener (QR 708)[3] | 0.30 parts |

[1] 40% solids suspension of Ex. 1
[2] 10% soln. in 1:1 IPA/Water
[3] 50% soln. in IPA To 100 parts of the adhesive, prepared as previously described, was added a combination of lithium salts, to increase ionic conductivity, ammonium hydroxide for pH adjustment, benzotriazole for corrosion inhibition and a thickener to improve coating characteristics. Each of the additional ingredients was slowly stirred into the adhesive composition and thoroughly mixed prior to coating.

Example 4

Tape Preparation Using A Primer Coating

The high temperature resistant, antistatic adhesive tape of the present invention was prepared by coating suitable film supports with a primer, which, after drying, was over-coated with a layer of the antistatic adhesive composition.

The primer composition was used as previously described or with addition of 0.5 parts of benzotriazole corrosion protection agent. A knurled roll applied a coating of primer on a 20 µm (1 mil) filled polyimide (Kapton) film. The coated film was dried at 180° F. for 1 min. with a resulting primer coating weight of 0.003 gm/sq. ft.

A 75 µm (3 mil) film of adhesive was then coated over the primer layer then dried for 3 mins. at 110° C. (2300° F.).

Examples 5–10C

Tape Properties

The electrical and adhesive properties of tapes including the invention are presented in the following table. Examples 5, C6 and C7 were tested at 10% relative humidity while samples 8, C9 and C10 were tested at 60% relative humidity, and the results are shown in Table 1.

Examples 5 and 8 are tapes of the current invention. Examples C6 and C9 comprise a commercially available tape known as 3M #92 Tape which has a silicone adhesive. Examples C8 and C10 are a commercially available tape known as 3M #1205.

Note that only the tapes of the invention exhibit both lack of adhesive transfer and low tribocharging.

TABLE 1

| | | Tribocharge Volts (3M Tester #711) | | |
|---|---|---|---|---|
| Tape Identity | Conductivity Ohms/sq. | Unwind | Removal from PC Board | Adhesive Transfer* |
| Ex. 5 | $4.8 \times 10^9$ | 3.0 | 35 | No transfer |
| Ex. C6 | $1.3 \times 10^{16}$ | >2000 | 670 | No transfer |
| Ex. C7 | $2.7 \times 10^{15}$ | 1414 | 680 | >30% Transfer |
| Ex. 8 | $2.7 \times 10^8$ | 2 | 4 | No transfer |
| Ex. C9 | $2.3 \times 10^{14}$ | 1311 | 581 | No transfer |
| Ex. C10 | $5.8 \times 10^{15}$ | 1223 | 566 | >30% Transfer |

*Adhesive transfer was measured at 287° C. (550° F.) with tape samples dipped into molten solder for 5 seconds.

Examples 11–12C

Example 11 was made as described in Example 1. Example 12C was made without any kind of primer. The table below shows the effect of various properties of using the primer of the invention; most properties were not affected greatly, but the two-bond test value of the tape of the invention was surprisingly twice that of the tape without a primer.

TABLE 2

| Property | No Primer | Rubber/Phenolic Primer |
|---|---|---|
| Two Bond | 54.72 N/100 mm | 109.45 N/100 mm |
| Adhesion to Steel | 12 N/100 mm | 11 N/100 mm |
| Unwind | 36 N/100 mm | 33 N/100 mm |
| Adhesion to Backing | 16 N/100 mm | 12 N/100 mm |
| Resistivity @ 10% RH | $2 \times 10^{10}$ ohm/sq | $2 \times 10^{10}$ ohm/sq |

Examples 13C–24C

The following examples were made as described in Example 1, except that the adhesives were coated on polyimide film having been precoated with various primers. The ingredients for the primers are listed, along with the effect on adhesive transfer in the table below. Tapes which showed transfer, i.e., failed, at ambient temperatures and at high temperatures are listed simply as "transfer".

Tapes which showed some improved level of adhesion at ambient temperatures, and failed at high temperatures have the rating for ambient temperature performance, i.e., fair, good, etc., and are noted to have such improved characteristics at ambient temperatures only. One treatment, a surface etch with potassium hydroxide showed good adhesion of the adhesive to the substrate, but had high tribocharging. Only the primer used in tapes of the invention showed excellent performance at ambient and high temperature as well as good electrical properties.

TABLE 3

| Primer | Adhesive Transfer Effect Ambient and High Temp. |
| --- | --- |
| Microetching | Transfer |
| Flash Lamp Treatment | Transfer |
| Latex Adhesive | Transfer |
| EA/MMA/Silane | Transfer |
| Silicone | Transfer |
| Silica Colloidal | Transfer |
| PVC/ZnO | Good/ambient temp only |
| Poly Aziridine | Fair/ambient temp |
| Rubber | Good/ambient temp |
| Rubber/Acrylic | Good/ambient temp |
| KOH Etching - 5% KOH soln. | Good/high tribo |
| Rubber/Phenolic | Excellent |

What is claimed is:

1. A heat-resistant anti-static pressure-sensitive adhesive tape comprising a substrate having opposing surfaces, at least one of said surfaces bearing thereon a acrylic microparticulate adhesive having an average diameter of at least about 1 micrometer, wherein the microparticles have a surface bearing thereon an ionic conductive material formed from a polymer electrolyte base polymer, and at least one ionic salt selected from the group consisting of salts of alkali metals and salts of alkaline earth metals, said adhesive being bonded to said substrate by means of a primer, said primer comprising at lease one phenolic resin and at least one rubbery compound, said adhesive tape being capable of surviving immersion in molten solder at about 260° C. for at least about 5 seconds.

2. A heat-resistant anti-static pressure-sensitive adhesive tape according to claim 1 wherein said primer comprises a phenol-formaldehyde resin.

3. A heat-resistant anti-static pressure-sensitive adhesive tape according to claim 1 wherein said primer comprises a rubbery compound selected from the group consisting of butyl rubber, acrylonitrile-butadiene, acrylonitrile-butadiene-styrene copolymers, styrene-butadiene-styrene, styrene-ethylene butylene-styrene copolymers, polychloroprene, polybutadiene, polyisoprene, styrene-isoprene-styrene, and mixtures thereof.

4. A heat-resistant anti-static pressure-sensitive adhesive tape according to claim 3 wherein said primer comprises a rubbery compound which is a mixture of at least two compounds selected from the group consisting of butyl rubber, acrylonitrile-butadiene, acrylonitrile-butadiene-styrene copolymers, styrene-butadiene-styrene, styrene-ethylene butylene-styrene copolymers, polychloroprene, potybutadiene, polyisoprene, styrene-isoprene-styrene.

5. A heat-resistant anti-static pressure-sensitive adhesive tape according to claim 4 wherein said primer coating comprises a mixture of acrylonitrile-butadiene-styrene copolymer and polychloroprene.

6. A heat-resistant anti-static pressure-sensitive adhesive tape according to claim 1 wherein said adhesive tape is capable of surviving immersion in molten solder at about 260° C. for at least about 10 seconds.

7. A heat-resistant anti-static pressure-sensitive adhesive tape according to claim 1 wherein said adhesive tape is capable of surviving immersion in molten solder at about 260° C. for at least about 20 seconds.

8. A heat-resistant anti-static pressure-sensitive adhesive tape according to claim 1 wherein said microparticulate adhesive comprises a polymer of monomers comprising:

a) at least about 70 parts of at least one alkyl (meth) acrylate or vinyl ester, b) correspondingly, up to about 30 parts of at least one polar monomer, to make 100 parts monomer, and wherein said ionic conductive material comprises a polymer electrolyte formed from a polymer electrolyte base polymer, said polymer electrolyte base polymer added in an amount of from about 0.1 part to about 10 parts.

9. A heat-resistant anti-static pressure-sensitive adhesive nape according to claim 1 wherein said polymer electrolyte base polymer is selected from the group consisting of polyethylene oxide, polyphenylene oxide, polyphenylene sulfide, polyethylene sulfide, polyethyleneimine, polypropylene oxide, polybutylene oxide, polybutylene sulfide, and polybutylene imine.

10. A heat-resistant anti-static pressure-sensitive adhesive tape according no claim 1 wherein said ionic conductive material comprises from about 0.01 moles to about 10 moles of at least one salt of an alkali metal or alkaline earth metal per mole of polymer electrolyte base unit.

11. A heat-resistant anti-static pressure-sensitive adhesive tape according to claim 10 wherein said salt is selected from the group consisting of LiCl, $LiNO_3$, $LiCF_3SO_3$, $LiSO_4$, LiOH, KOH, NaSCN, NaI, $BaSO_3CF_3$, and $NH_4OH$.

12. A heat-resistant anti-static pressure-sensitive adhesive tape according to claim 11 wherein said microparticulate adhesive comprises a polymer of monomers comprising:

a) at least about 85 parts by weight of at least one alkyl (meth)acrylate or vinyl ester, and b) correspondingly, up to about 15 parts by weight of at least one polar monomer, to make 100 parts monomer, wherein said ionic conductive material comprises a polymer electrolyte material formed from about 0.1 part to about 10 parts of a polymer electrolyte base polymer.

13. A heat-resistant anti-static pressure sensitive adhesive tape according to claim 12 wherein the alkyl (meth)acrylate is selected from the group consisting of isooctyl (meth) acrylate, 2-ethylhexyl (meth)acrylate, isononyl (meth) acrylate, isoamyl (meth)acrylate, isodecyl (meth)acrylate, and butyl (meth)acrylate.

14. A heat-resistant anti-static pressure-sensitive adhesive tape of claim 12 wherein the vinyl ester is selected from the group consisting of vinyl 2-ethylhexanoate, vinyl caproate, vinyl laurate, vinyl pelargonate, vinyl hexanoate, vinyl propionate, vinyl decanoate, and vinyl octanoate.

15. A heat-resistant anti-static pressure-sensitive adhesive tape according to claim 12 wherein said polar monomer is selected from the group consisting of N-vinyl-2-pyrrolidone, N-vinyl caprolactam, acrylonitrile, vinyl acrylate, diallyl phthalate, acrylic acid, methacrylic acid, itaconic acid, hydroxyalkyl acrylates, cyanoalkyl acrylates, acrylamides, and substituted acrylamides.

16. A heat-resistant anti-static pressure-sensitive adhesive tape according to claim 1 wherein said substrate is selected from the group consisting of polyimide, polyphenylene sulfide, heat-treated non-wovens, fiberglass, metallized polymeric film, ceramic sheet material, and metal foil.

17. A heat-resistant anti-static pressure-sensitive adhesive tape according to claim 16 wherein said substrate is polyimide.

* * * * *